(12) United States Patent
Du et al.

(10) Patent No.: US 8,826,193 B1
(45) Date of Patent: Sep. 2, 2014

(54) DETECTION AND REMOVAL OF SELF-ALIGNED DOUBLE PATTERNING ARTIFACTS

(71) Applicant: Synopsys, Inc., Mountain View, CA (US)

(72) Inventors: Yuelin Du, Champaign, IL (US); Gerard Luk-Pat, Sunnyvale, CA (US); Alexander Miloslavsky, Sunnyvale, CA (US); Benjamin Painter, Portland, OR (US); James Shiely, Aloha, OR (US); Hua Song, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/779,466

(22) Filed: Feb. 27, 2013

(51) Int. Cl.
*G06F 17/50* (2006.01)

(52) U.S. Cl.
CPC .................................. *G06F 17/5081* (2013.01)
USPC .............................................. 716/52; 716/51

(58) Field of Classification Search
CPC ........... G03F 1/144; G03F 1/36; G03F 7/705; G06F 17/5068; G06F 17/5081
USPC ...................................... 716/51, 52
See application file for complete search history.

(56) References Cited

U.S. PATENT DOCUMENTS

| | | | |
|---|---|---|---|
| 8,266,560 B2 | 9/2012 | McIlrath | |
| 8,296,702 B2 | 10/2012 | Mukherjee | |
| 8,355,807 B2 | 1/2013 | Fan et al. | |
| 8,375,342 B1 | 2/2013 | Nequist et al. | |
| 8,404,403 B2 | 3/2013 | Ogadhoh et al. | |
| 2011/0265051 A1 | 10/2011 | Yeh et al. | |
| 2012/0137261 A1* | 5/2012 | Ban et al. | 716/52 |
| 2013/0034807 A1 | 2/2013 | Fujimura et al. | |
| 2013/0131857 A1 | 5/2013 | Fan et al. | |

OTHER PUBLICATIONS

Flexible 2D Layout Decomposition Framework for Spacer-Type Double Pattering Lithography, by Ban et al., DAC'11, Jun. 5-10, 2011, San Diego, California, Copyright © 2011 ACM 978-1-4503-0636-Feb. 11, 2006.
Self-Aligned Double Patterning Decomposition for Overlay Minimization and Hot Spot Detection, by Zhang et al., DAC'11, Jun. 5-10, 2011, San Diego, California, Copyright © 2011 ACM 978-1-4503-0636-Feb. 11, 2006.

* cited by examiner

*Primary Examiner* — Vuthe Siek
(74) *Attorney, Agent, or Firm* — Adams Intellex, PLC

(57) ABSTRACT

Mask design techniques for detection and removal of undesirable artifacts in SADP processes using multiple patterns are disclosed. Artifacts or spurs result from lithographic and chemical processing of semiconducting wafers. The spurs are undesirable because they can cause unwanted connections or act as electrical antennas. Spurs are detected using rule-based techniques and reduced by modifying lithographic masks. The severity of the detected spurs is determined, again using rule-based techniques. The effects of detected spurs can be reduced by modifying the decomposition of the drawn patterns into the two masks used for lithography. Mandrel masks are modified by add dummy mandrel material, and trim masks are modified by removing trim material. The resulting multi-pattern arrangement is used to fabricate the critical design elements that make up the semiconductor wafers.

42 Claims, 16 Drawing Sheets

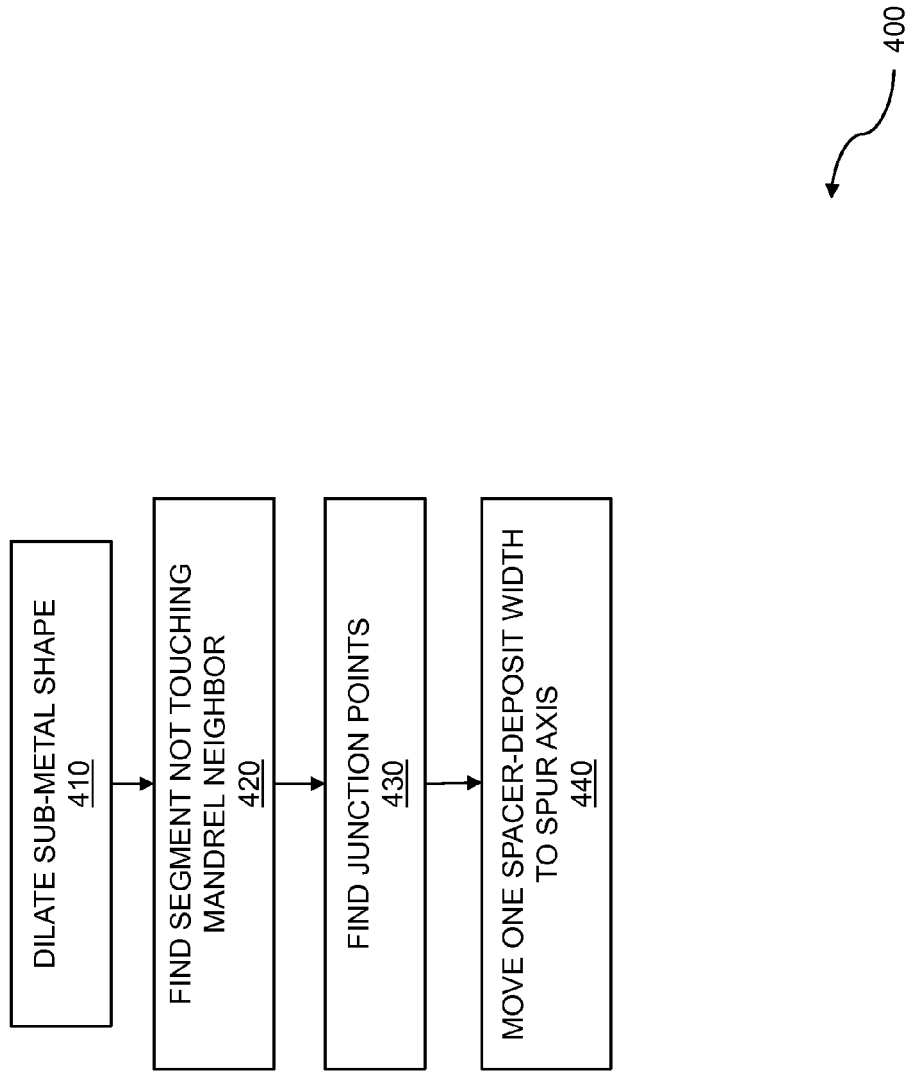

DETECTION AND REMOVAL OF SELF-ALIGNED DOUBLE PATTERNING ARTIFACTS

FIELD OF ART

This application relates generally to design automation and more particularly to detection and removal of self-aligned double patterning artifacts.

BACKGROUND

Integrated circuits are becoming increasing difficult to construct because the feature sizes at minimum dimensions for the various structures which make up the circuits. Modern integrated circuits, or chips, enjoy widespread use in a great variety of devices and systems, so the circuits must be efficiently and cost effectively constructed. Chips are typically manufactured using highly complex techniques based on elaborate, multi-step processes including some type of lithographic printing and chemical processing. The processing is performed on a semiconductor substrate such as silicon, although other materials, including compound semiconductors formed from materials such as gallium and arsenic, are also used. Modern fabrication processes may consist of hundreds or thousands of manufacturing and handling steps. In order for a given electronic device or system to function as designed, each of the steps in the fabrication process must be completed successfully. Each lithographic, process, and handling step has a unique purpose. For example, the lithographic steps are used to expose, or "print," desired patterns and features onto a semiconductor substrate. The printing process is reminiscent of photographic processes that involved shining light through a negative to expose light sensitive paper. Similarly, specific wavelengths of light are shone through masks to print extremely fine structures onto a substrate. Following a printing step, the physical structures are revealed when chemical processing is applied to the substrates. Returning to the photography analogy, the chemical processing "develops" the fine structures and patterns on the substrates much like certain chemicals develop images on photographic paper during traditional photographic processing. The chemical processing removes, at a particular level on the substrates unwanted superfluous material while leaving intact the desired structures and patterns printed during the lithographic step. The lithographic and chemical processing steps are repeated numerous times to produce the desired electronic devices and systems.

The printing of minimum-size features and structures onto a substrate has been performed using light-based approaches. Light shines through a mask to transfer the pattern of the mask onto the substrate. The printing may be performed using positive (direct copy) or negative (reversed copy) methods. Since the minimum feature sizes of patterns and structures on the chips are now comparable to or smaller than the wavelength of visible light, lithographic techniques have been enhanced. Improved mask techniques have been developed, which, along with the development of light sources with shorter wavelengths, have helped support printing of ever-smaller features and structures. The combination of improved masks and decreased light wavelengths has significantly improved the resolution of fine features and structure sizes. After the features and structures have been printed, advanced chemical processing must resolve the small design details in such a way that all of the resulting features and structures function as designed. In order to produce a working chip, the lithographic and chemical processing steps must all be capable of functioning together to accurately produce the desired patterns and structures.

SUMMARY

Techniques, implemented to improve fabrication of integrated circuits, are used to detect and fix wafer-print artifacts. The artifacts may be "spurs" which protrude significantly from a desired shape and can create circuit failure points in the wafer processing steps. Further, the artifacts may form unwanted electrical antennas which can emit or capture noise, thus contaminating and corrupting critical signals used within a circuit. Critical processing artifacts including spurs are detected for a given fabrication layer using rules-based techniques. When a spur is detected, the severity of the spur may be estimated, again using rules-based techniques. The effect of the detected spurs may be reduced by modifying the decomposition of the drawn patterns on the two masks that may be used for printing the patterns. The modification may include avoiding notches in the negative contours by adding mandrel-mask material or removing trim-mask material. A computer-implemented method for layout analysis is disclosed comprising: obtaining a design layout comprising a representation for a plurality mask levels wherein the plurality of mask levels include a mandrel mask and a trim mask; dilating a sub-metal shape derived from at least one of the plurality of mask levels; and identifying an artifact based on the sub-metal shape which was dilated.

The identifying may be based on rules. The method may further comprise estimating a severity of the artifact. The estimating may be rule based. The estimating may further comprise computing overlap between a drawn shape and a beveled version of a shape from the trim mask. The method may further comprise fixing the artifact based on modifying the trim mask to minimize the overlap. The method may further comprise fixing the artifact that was identified. The artifact may include a spur. The fixing the artifact may include reducing the spur. The fixing of the artifact may further comprise modifying a decomposition of drawn patterns. The fixing may further comprise adding a mandrel-mask shape. The fixing may further comprise removing a trim-mask shape. The drawn patterns may be based on two mask levels. The fixing may further comprise merging mandrel shapes. The fixing may comprise modifying the mandrel mask based on mandrel neighbor shapes. The fixing may further comprise merging, extending, or deleting mandrel structures on the mandrel mask based on a number of mandrel structure neighbor shapes. The method may further comprise estimating a severity of the artifact wherein the estimating is rule based and wherein the estimating comprises computing overlap between a drawn shape and a beveled version of a shape from the trim mask and wherein the fixing the artifact is based on modifying the trim mask to minimize the overlap. The fixing may include performing mandrel structure extension to avoid end-to-end spacers on the mandrel mask. The fixing may include performing mandrel structure merging to avoid end-to-end spacers on the mandrel mask. The fixing may be systematically applied across at least one of the plurality of mask levels. The artifact may occur when a rounded trim-pattern intersects a rounded spacer-pattern. The artifact may occur indirectly based on a gap between spacer shapes. The artifact may occur at a concave corner of a spacer shape or a trim shape. The identifying may be based on weighting. The weighting may include having concave corners being given a higher weighting. A structure may be defined by mandrel structures on the mandrel mask along with spacer structures grown around the mandrel structures and trim shapes on the trim mask. The dilating the sub-metal shape may be by a spacer width. The identifying may be based on finding a dilated shape that does not touch a mandrel neighbor. The method may further comprise finding a junction point between a shape touching a mandrel and a shape not touching a mandrel and determining a spur axis location based on moving along the shape not touching the mandrel by a spacer-deposit width. The design layout may include shapes for self-aligned double patterning. The self-aligned double patterning may be based on spacer-is-dielectric technology. The plurality of mask levels may define sub-metal shapes, spacer-deposit widths, segments, or mandrel neighbors.

In embodiments, a computer-implemented method for semiconductor layout analysis comprises: obtaining a design layout comprising a representation for a plurality mask levels including a mandrel mask and a trim mask; dilating a sub-metal shape derived from the plurality of mask levels; identifying an spur based on the sub-metal shape which was dilated; and modifying one or more of the plurality of mask levels to reduce the spur that was identified. In some embodiments, a computer system for design analysis comprises: a memory which stores instructions; one or more processors coupled to the memory wherein the one or more processors are configured to: obtain a design layout comprising a representation for a plurality mask levels wherein the plurality of mask levels include a mandrel mask and a trim mask; dilate a sub-metal shape derived from at least one of the plurality of mask levels; and identify an artifact based on the sub-metal shape which was dilated. In embodiments, a computer program product embodied in a non-transitory computer readable medium for design analysis comprises: code for obtaining a design layout comprising a representation for a plurality of mask levels wherein the plurality of mask levels includes a mandrel mask and a trim mask; code for dilating a sub-metal shape derived from at least one of the plurality of mask levels; and code for identifying an artifact based on the sub-metal shape which was dilated.

Various features, aspects, and advantages of various embodiments will become more apparent from the following further description.

BRIEF DESCRIPTION OF THE DRAWINGS

The following detailed description of certain embodiments may be understood by reference to the following figures wherein:

FIG. 4 is a flow diagram for spur axis detection.

DETAILED DESCRIPTION

Modern electronic devices and systems are based on large numbers of semiconductor devices. As device count increases—modern device counts can easily run to tens or hundreds of millions of active devices—the feature sizes of the individual devices decrease. Minimum feature sizes are routinely comparable to the wavelength of visible light, and advanced technologies may be based on features that are smaller—even significantly small than visible light. Many of these advanced technologies are manufactured using processes based on lithography and chemical processing. However, lithography is becoming increasing difficult to perform properly. The advent of smaller lithographically printed features also results in unwanted artifacts left over from the process. The artifacts, which may be metallic spurs, are highly undesirable because the spurs may cause unintended electrical connections and may act as undesired electrical antennas. The antennas can be both sources and receivers of noise to a degree that the noise can overwhelm the intended signals and, by extension, the proper operation of a chip.

The spurs result from the limitations of the lithographic and chemical processing steps used to manufacture semiconductor chips. The effects of the spurs are reduced by modifying the decomposition of the drawn (desired) pattern into the masks used by the lithographic process. The spurs are frequently found on the sub-metal shapes used to form the desired features and structures on a semiconductor chip. The spurs are first detected using geometric means and rule-based estimation. The severity of the detected spurs is then estimated. The process is rule-based in order to more quickly and efficiently estimate spur severity than is possible using model-based techniques. The estimation is based on determining the overlap area of three regions including spur-axis triangles, dilated sub-metal segments, and a beveled trim mask. Spurs are then addressed by modifying mandrel masks or trim masks. Various rules are applied to determine how the masks may be best modified to reduce artifacts and spurs.

In the disclosed concept, manufacturing spurs for a given level are detected using rules-based techniques. The severity of the detected spurs is estimated using rules-based techniques. The masks used by the lithographic process to print a drawn pattern are modified. The decomposition of the drawn pattern is also modified by adding mandrel-mask "dummy" material or by removing trim-mask material in order to avoid notches in the negative contours. These two masks are then used in a multi-patterning printing process to fabricate patterns without spurs. The disclosed concepts are described in the context of self-aligned double patterning (SADP) and spacer-is-dielectric (SID) processes, but numerous other processes could use this concept for the manufacturing of semiconductor chips.

Figure 1:
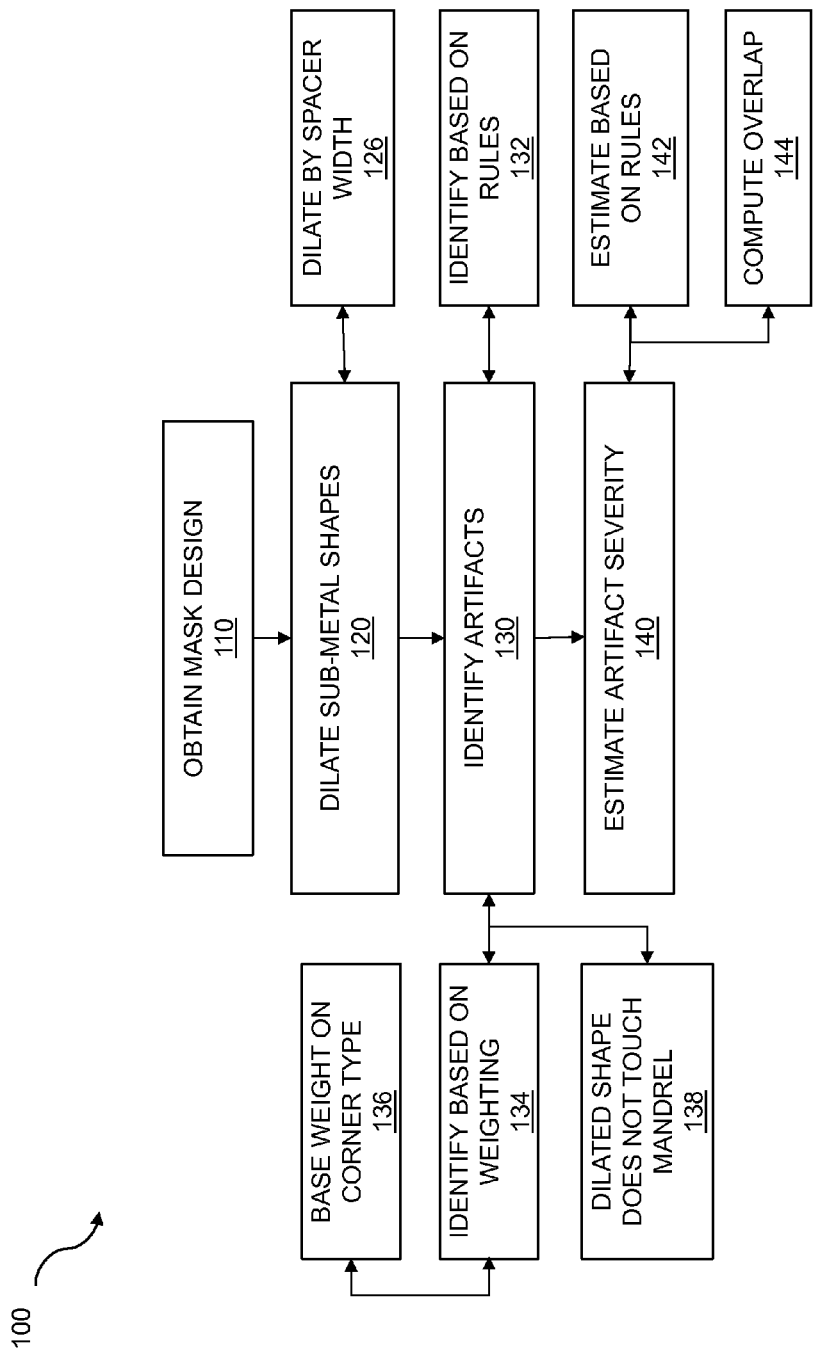
FIG. 1 is a flow diagram for detection and removal of artifacts.

FIG. 1 is a flow diagram for detection and removal of artifacts. The flow 100 describes a computer-implemented method for layout analysis. The layout includes a variety of shapes to be constructed on a semiconductor wafer. The shapes describe desired features and structures that can be constructed using a combination of lithographic and chemical processes. The flow 100 includes obtaining a design 110 layout comprising a representation for a plurality mask levels wherein the plurality of mask levels include a mandrel mask and a trim mask. The masks may be used to fabricate various features and structures on a semiconductor wafer. The masks may be part of a multi-patterning lithographic process for printing critical design elements. A multi-patterning lithographic process may include self-aligned double patterning (SADP). A SADP process may include spacer-is-dielectric (SID) process or processes.

The flow 100 further comprises dilating a sub-metal shape 120 derived from at least one of the plurality of mask levels. Detection of the sub-metal shape may include a variety of geometric operations including the dilation of a shape. A shape may be an artifact of lithographic and chemical processing. An artifact may be a spur. Dilation may include finding any segments that are not touching a mandrel neighbor. The dilating of the sub-metal shape may be by a spacer width 126 or other appropriate width.

The flow 100 includes identifying an artifact 130 based on the sub-metal shape which was dilated. Artifacts may be identified as part of a fixing process. Identifying of an artifact may include finding, along a dilation, any segment that is not touching a mandrel neighbor. A mandrel neighbor may be a main mandrel or an additional mandrel. Identifying may include finding junction points. Junction points may be between a segment of a dilation touching a mandrel and a segment of a dilation not touching a mandrel. Dilated sub-metal corners may also count as junction points. A spur-axis location may be found by starting at a junction point and moving along a segment not touching a mandrel and away from a segment touching a mandrel by one spacer-deposit width or another width. A spur-axis location may be found if two junction points are separated by a distance less than two spacer-deposit widths or another width. The midpoint between two such junction points may be a spur-axis location. The identifying may be based on rules 132. The rules may be used to efficiently direct design analysis. Rule-based analysis may be more computationally efficient than model-based analysis. The identifying may be based on weighting 134. For example, identifying may be based on mask layer, types of shapes, proximity of shapes, and so on. The weighting may include assigning concave corners 136 a higher weighting, as concave corners may be more likely to present artifacts. This increased weighting means that concave corners may be examined before other structures. The identifying may be based on finding a dilated shape which does not touch a mandrel neighbor 138. A dilated shape not touching a mandrel neighbor may be given a higher weight.

The flow 100 may further comprise estimating a severity of the artifact 140. Estimating a severity may include estimating the severity of a sub-metal spur. Estimating may be based on geometrical operations or other operations. A severity may be estimated based on an overlap area of three regions or other number of regions. Regions that may be used for determination of overlap area may include spur-axis triangles, dilated sub-metal segments, and a beveled trim mask. A spur axis triangle may be found by centering a triangle on a spur axis, with the base of a triangle on a sub-metal edge and an opposite vertex of a triangle pointing outward from a sub-metal shape. The triangle may be an equilateral triangle with side length equal to the length of a non-touching segment. A maximum side length of an equilateral triangle may be twice a spacer-deposit width. For diagonal spurs, spur-axis triangles may be constructed separately, with one triangle for each Manhattan direction, where Manhattan directions are North-South and East-West. Sub-metal segments may be constructed by finding junction points of a spacer-deposit triangle with sub-metal edges. Sub-metal segments may be formed between adjacent junction points. Any portion of a sub-metal segment which may touch a subtractive trim triangle may be deleted. Sub-metal segments may be dilated outward from a sub-metal edge by a distance of one spacer-deposit width or another width. A trim mask may be beveled. A bevel may approximate corner rounding which may result from a lithographic process. At each inside trim corner, an isosceles triangle with perpendicular sides equal in length to a specified corner-rounding radius may be added. An isosceles triangle may be subtracted at each outside trim corner. The estimating may be rule-based 142. Rules may be used to efficiently direct artifact severity estimation. The estimation may be more efficient that model-based analysis. The estimating may further comprise computing the overlap 144 between a drawn shape and a beveled version of a shape from the trim mask. An overlap area may be used for estimating severity of a sub-metal spur or other artifact.

Figure 2:
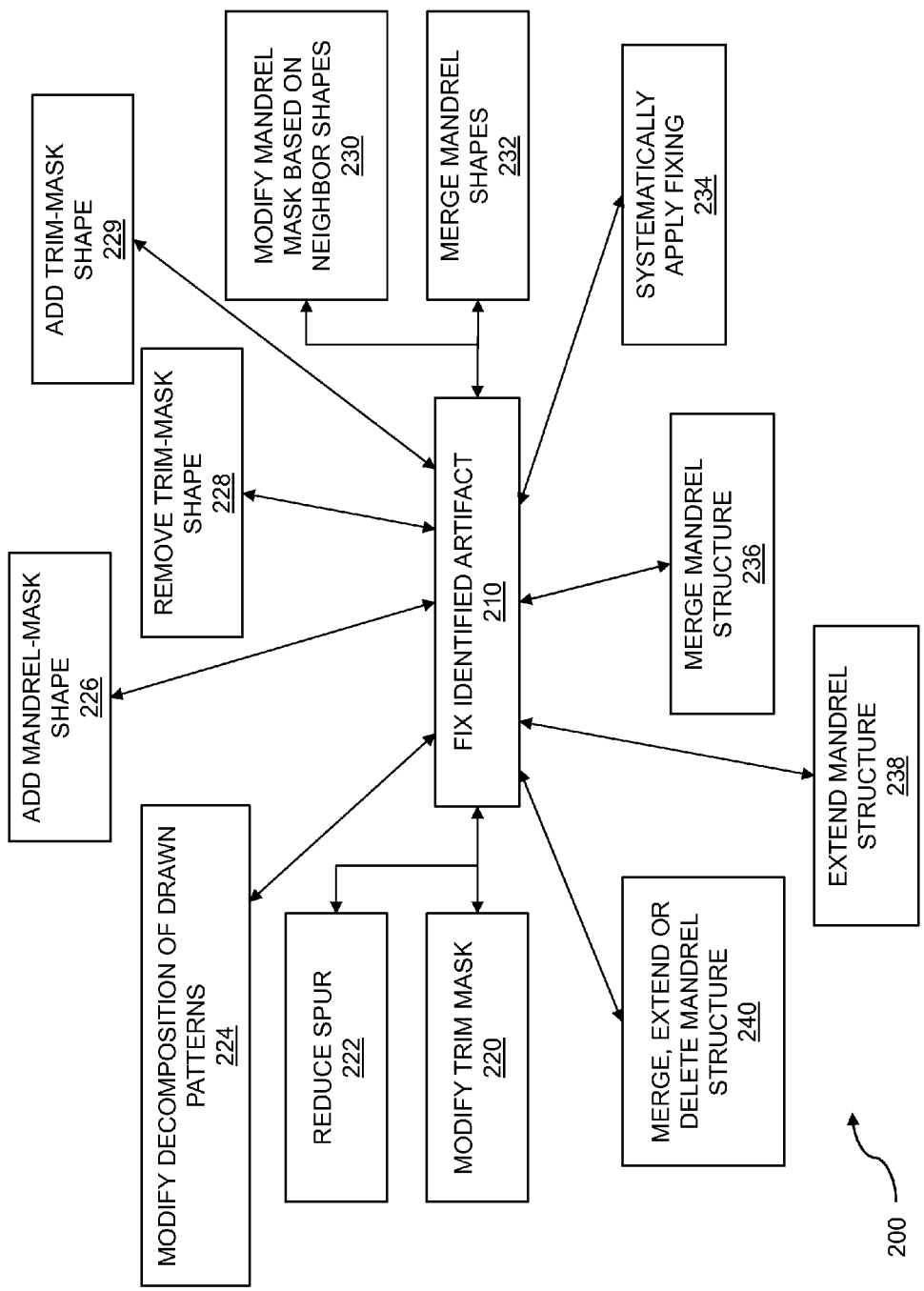
FIG. 2 is a flow diagram showing fixing of artifacts.

FIG. 2 is a flow diagram showing fixing of artifacts. A flow 200 may continue from or be part of a previous flow 100. In some embodiments, the flow 200 may stand on its own and may work from a pre-existing semiconductor chip design with wafer-print artifacts or other artifacts. The artifacts may result from lithographic and chemical processes or other processes. The artifacts may be attached to drawn shapes based on patterns. The drawn patterns may be based on two mask levels. The flow 200 may further comprise fixing the artifact that was identified 210. The artifact may be a spur. The spurs may be on sub-metal shapes. Fixing may be rule-based to improve efficiency compared to model-based approaches. The flow 200 may further comprise fixing the artifact based on modifying the trim mask 220 to minimize the overlap. Trim edges may be moved, including trim edges within the spacer deposit. For example, a trim straight edge may be moved to within a spacer-deposit width of a sub-metal edge if there are no trim vertices near a given spur axis. As another example, a trim vertex with a comparable curvature to that of a sub-metal vertex may be moved to coincide with a sub-metal vertex if there is a trim vertex near the spur axis. A trim vertex with an opposite curvature to that of a given sub-metal vertex may be moved to minimize the overlap between a trim mask and a spur-axis triangle. A trim vertex may be moved to maximize the length of a trim-defined edge if there is a trim vertex on a sub-metal straight edge. The fixing of the artifact may include reducing the spur 222. A spur may be reduced by modifying one or more mandrel masks and/or by modifying one or more trim masks. The fixing of the artifact may further comprise modifying a decomposition of drawn patterns 224. Masks are used to transfer drawn patterns to a semiconductor wafer. Drawn patterns may be decomposed into masks for printing. Depending on design style, two or more masks may be used. The fixing may further comprise adding a mandrel-mask shape 226. Adding a mandrel mask shape may include adding additional "dummy" mandrel material. The adding may reduce artifacts, including spurs. The fixing may further comprise removing a trim-mask shape 228 or adding a trim-mask shape 229. Removing a trim-mask shape may include removing trim-mask material in the region of a spur or another artifact. Removing trim-mask material may result in the removal of notches in negative contours. Adding a trim-mask shape may include adding trim-mask material in the region of a spur or another artifact. Adding trim-mask material may result in the removal of notches in negative contours.

The flow 200 may further comprise estimating a severity of the artifact wherein the estimating is rule-based, the estimating comprises computing overlap between a drawn shape and a beveled version of a shape from the trim mask, and the fixing the artifact is based on modifying the trim mask to minimize the overlap. The fixing may comprise modifying the mandrel mask based on mandrel neighbor shapes 230. The fixing may include merging mandrels, extending mandrels, deleting mandrels, and so on. The fixing may further comprise merging mandrel shapes 232. For example, mandrels may be merged if there is a nearby main mandrel and in total two or more mandrel pieces, where the mandrel pieces may be either main mandrel pieces or additional mandrel pieces. The fixing may be systematically applied 234 across at least one of the plurality of mask levels. The fixing may include merging, extending, deleting, and so on across a mask level, between and among mask levels, and the like. The fixing may begin with spurs with a higher severity, then move to spurs with a lower severity. The scope of the fixing may be narrow to start, then expand as higher severity spurs are fixed and lower severity spurs become targets for fixing. The fixing may include performing mandrel structure extension 236 to avoid end-to-end spacers on the mandrel mask. A mandrel may be extended if there is a nearby main mandrel, and if there is only one piece of mandrel where the one piece of mandrel may be a main mandrel or an additional mandrel. Line-end shortening may be reduced by mandrel extension. The fixing may further comprise merging, extending, or deleting mandrel structures 240 on the mandrel mask based on a number of mandrel-structure neighbor shapes. Mandrel structures may be merged, extended, deleted, and so on, based on the types and locations of adjacent mandrels. The purpose of merging and extending mandrels may be to reduce line-end shortening, among other potential purposes. The amount by which a mandrel may be merged, extended, or deleted may depend on one spacer-deposit width or another width.

Figure 3A:
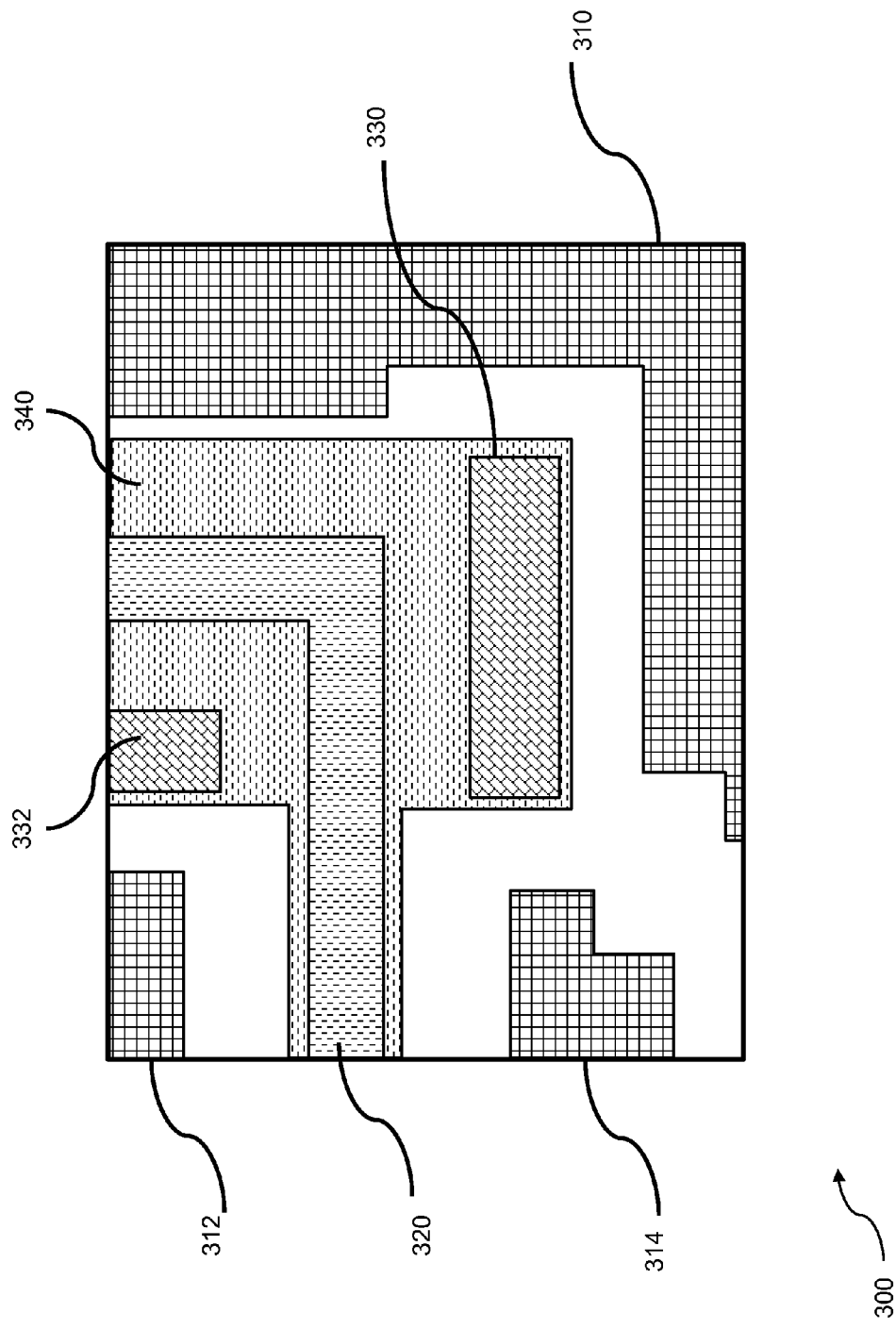
FIG. 3A is an example layout showing spur location detection.

FIG. 3A is an example layout for spur location detection. A group of shapes 300 is shown in order to illustrate the impact of drawn shapes on detecting artifacts. The group of shapes may represent a design layout, and the design layout may include shapes for self-aligned double patterning (SADP). A computer-aided design tool may generate the design layout. The self-aligned double patterning may be based on spacer-is-dielectric (SID) technology. An artifact or plurality of artifacts may be spurs—unwanted superfluous material which may cause unintended electrical connections or which act as electrical antennas. An artifact may result from lithographic and chemical processes. An artifact may result, for example, from rounding caused by an etching process and may occur at various levels in the semiconductor chip and affect various shapes. The artifact may occur indirectly based on a gap between spacer shapes. Example shapes 300, or similar shapes, may be produced using design automation tools configured to draw various features on a semiconductor for fabrication using masks. The plurality of mask levels may define sub-metal shapes, spacer-deposit widths, segments, or mandrel neighbors. The various features on a semiconductor result in structures. A structure may be defined by mandrel structures on the mandrel mask along with spacer structures grown around the mandrel structures and trim shapes on the trim mask. For example, shapes 320, 330, and 332 may represent a target design. In this example, shape 320 represents a main mandrel, while example shapes 310, 312, and 314 represent additional mandrel material or "dummy" material that is added as part of the fabrication process. The dummy material may be formed by positive contours. Example shapes 330 and 332 represent sub metal which may be created by negative contours. Example shape 340 represents a trim mask where material is removed in order to help achieve the target design.

Figure 3B:
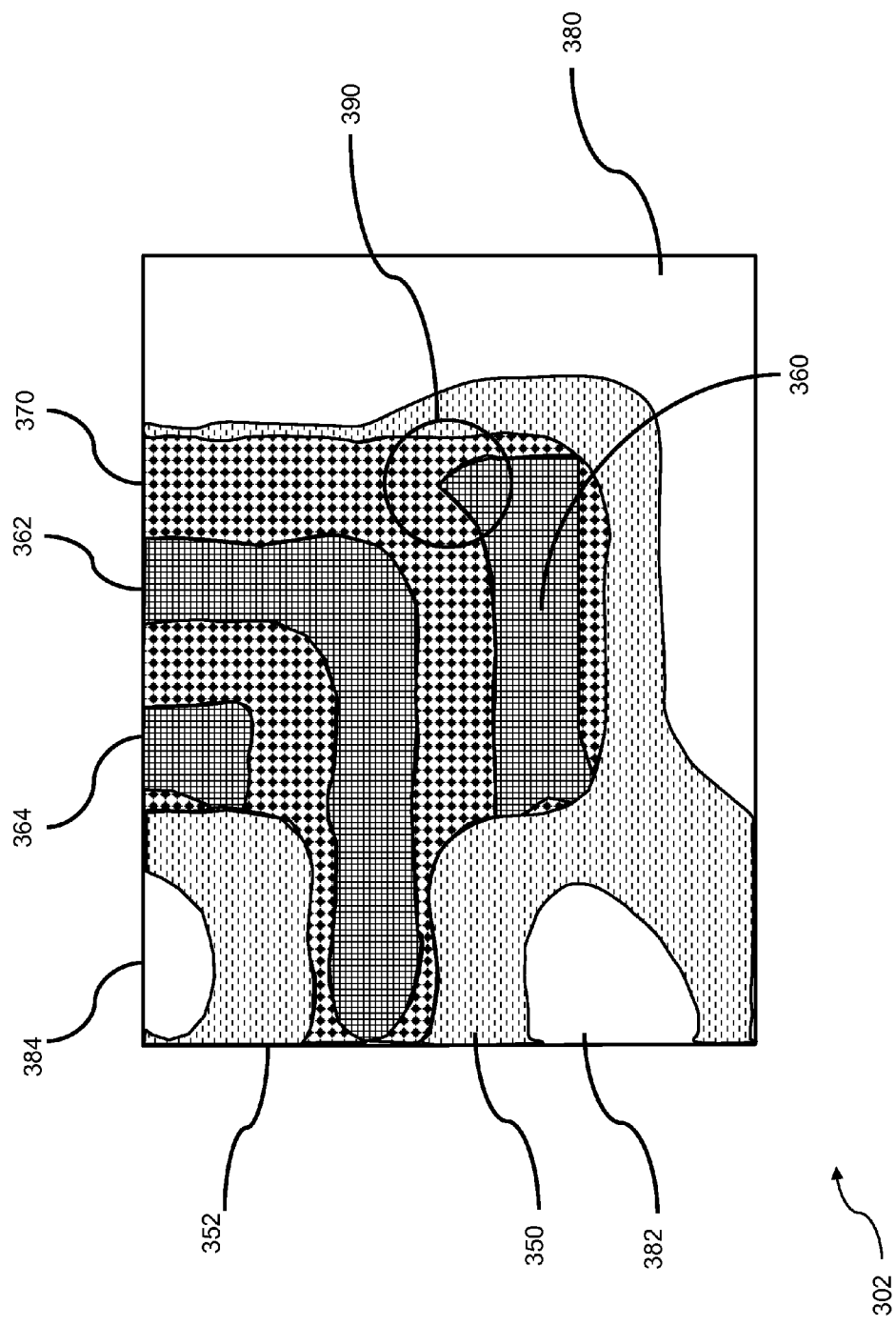
FIG. 3B shows example semiconductor shapes showing final contours.

FIG. 3B shows example semiconductor shapes showing final contours. A group of shapes 302 is shown to illustrate the final contours of mandrel, sub metal, spacer, and trim drawn shapes. The contours of the shapes may include one or more artifacts, where an artifact may include a spur. The contours of the shapes may differ from the drawn shapes due to the lithographic and chemical processes used for fabricating integrated circuits. The final contours may result from a self-aligned double patterning process. The SADP process may be based on a spacer-is-dielectric technology. As before, an artifact may be a spur comprising unwanted material. The final contours may result from lithographic and chemical processes which inadvertently produced artifacts such as spurs. Example shapes 302, or similar shapes, may be produced from lithographic and chemical processes. The final contours refer to structures on a semiconductor chip. In this example, shapes 360, 362, and 364 represent the target design. The final contours of 360, 362, and 364 differ from the desired target design. Example shapes 380, 382, and 384 represent additional mandrel or dummy feature structures which were added to aid in forming the desired target design. Example shape 370 represents a trim mask where material is removed as part of the fabrication process. Example structures 350 and 352 represent spacer deposits. Example structure 390 represents an undesirable artifact or spur. As mentioned above, a spur may cause undesirable electrical connections or may form electrical antennas.

FIG. 4 is a flow diagram for spur axis detection. A flow 400 may continue from or be part of a previous flow 100. In some embodiments, the flow 400 may stand on its own and may work from a pre-existing semiconductor chip design with wafer-print artifacts or other artifacts. The artifacts may result from lithographic and chemical processes or other processes. Spur axis detection may be rule-based to achieve improved efficiency compared to model-based approaches. The flow 400 may include detecting artifacts including spurs. The spurs may be on sub-metal shapes. The detecting of spurs may be on mandrel shapes or other shapes. The detecting may include geometric operations or other operations designed to detect spurs. The flow 400 includes dilating a sub-metal shape 410 derived from at least one of the plurality of mask levels. The dilating of a sub-metal shape may be an amount equal to the width of the spacer-deposit or by another appropriate width. A plurality of sub-metal artifact dilations may result, depending on the number of artifacts present on a given level. The flow 400 includes identifying, where the identifying may be based on finding a dilated shape which does not touch a mandrel neighbor 420. The finding may be along dilation 410 or other dilations. Mandrel neighbors may include a main mandrel, an additional mandrel, and so on. A mandrel neighbor which is not touched may be a main mandrel, an additional mandrel, and so on.

The flow 400 may further comprise finding a junction point 430 between a shape touching a mandrel and a shape not touching a mandrel. A mandrel may be a main mandrel, an additional mandrel, and so on. Dilated sub-metal corners may also count as junction points. For a given shape, the flow 400 may further include determining a spur axis location based on moving along the shape not touching the mandrel by a spacer-deposit width 440 or another width. If two junction points are separated by a distance of less than 2 spacer-deposit widths, then the midpoint between the two junction points may be the spur-axis location.

Figure 5:
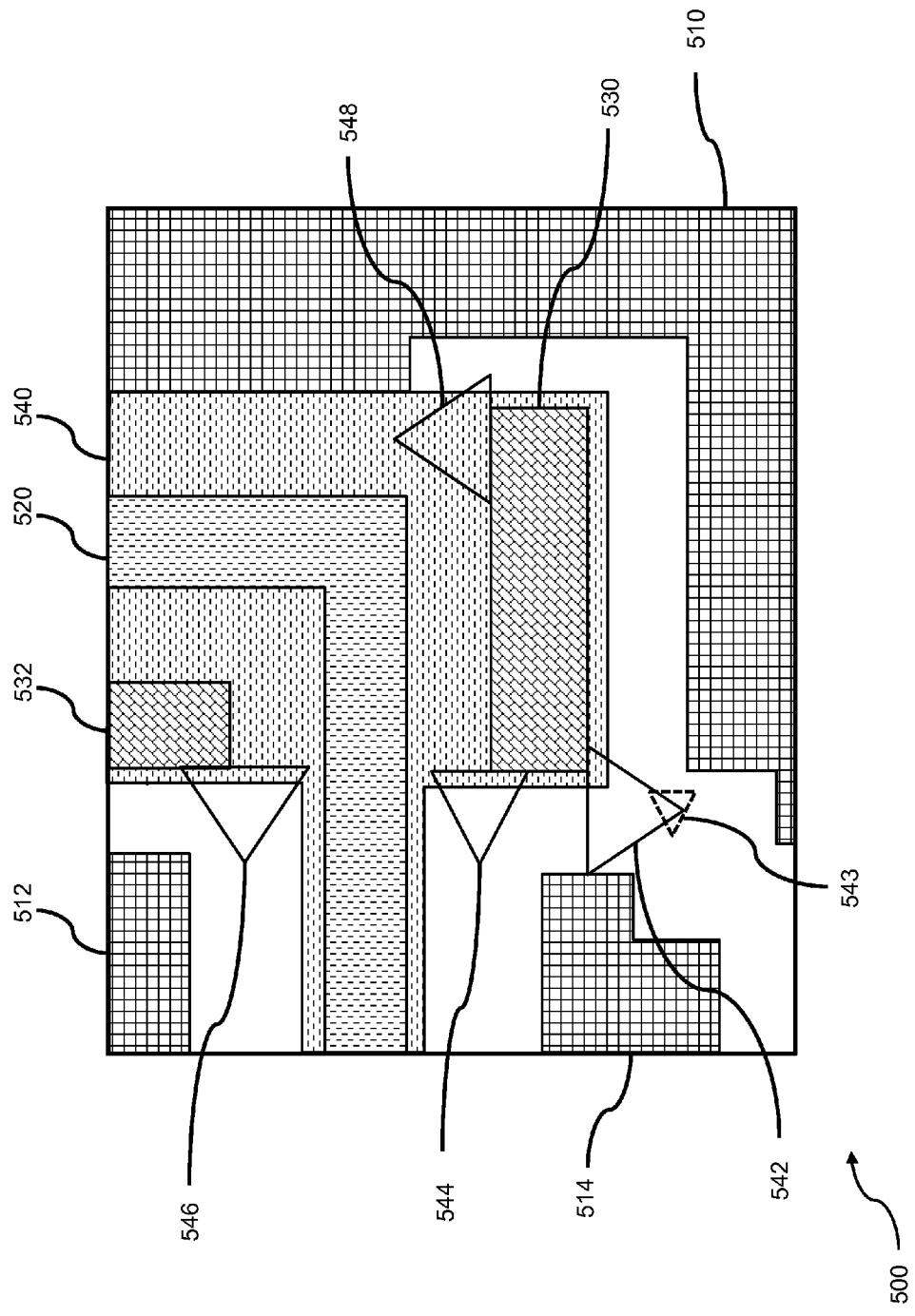
FIG. 5 is an example layout showing spur severity estimating.

FIG. 5 is an example layout showing spur-severity estimating. A group of shapes 500 is shown to illustrate spur-severity estimating. A group of shapes may represent a design layout, where the design layout may include shapes for self-aligned double patterning (SADP). The example layout may include estimating the severity of an artifact. A computer-aided design tool may generate the design layout. The self-aligned double patterning may be based on spacer-is-dielectric (SID) technology. As illustrated in FIG. 3A and FIG. 3B, an artifact or plurality of artifacts may be spurs, where spurs are unwanted superfluous material which may cause unintended electrical connections or act as electrical antennas. An artifact may result, for example, from rounding caused by an etching process. The artifact may occur at various levels in the semiconductor chip and may be attached to various shapes. Example shapes 500, and similar types of shapes, may be produced using design automation tools to draw the various features and their contours on a semiconductor for fabrication using masks. As before, the plurality of mask levels may define sub-metal shapes, spacer-deposit widths, segments, mandrel neighbors, and the like. For example, shapes 520, 530, and 532 may represent a target design on which artifacts may be identified and where the artifacts may be spurs. In the example given, shape 520 represents a main mandrel, while example shapes 510, 512, and 514 represent additional mandrel material—so called "dummy" material which is added as part of the fabrication process. The dummy material may be formed by positive contours. Example shapes 530 and 532 represent sub metal which may be created by negative contours. Example shape 540 represents a trim mask where material is removed in order to help achieve the target design.

Example shapes 542, 543, 544, 546, and 548 are triangles which may be used to evaluate spur severity identified on sub-metal shapes. The spur locations shown are on sub-metal shapes between a main mandrel and additional mandrels. The severity of a given spur may be determined by the overlap of three regions, which may include the spur axis triangles 542, 543, 544, 546, and 548; dilated sub-metal segments; and a beveled trim mask. For the first region, spur-axis triangles are constructed. For example, shapes 542, 543, 544, 546, and 548 show spur-axis triangles. The triangles may be centered on a spur axis with the base of the triangle on a sub-metal edge and the opposite vertex of the triangle pointing outward from the sub-metal shape. The triangle may be an equilateral triangle with a side length which may be equal to the length of a non-touching segment. A side length may be twice the size of a spacer-deposit width. Additionally, a rectangle may be constructed by dilating a sub-metal segment. The junction points of spacer-deposit triangles and sub-metal edges may be found. Sub-metal corners may also be junction points. Sub-metal segments may be fabricated between adjacent junction points. Any portion of a sub-metal segment which touches a subtractive-trim triangle may be deleted. Sub-metal segments which are outward from a sub-metal edge may be dilated by a distance of one spacer-deposit width or other width. In the case where a sub-metal corner has abutting sub-metal segments on both sides, a dilated square may be added between dilated sub-metal segments. For the third region, a trim mask may be beveled. Trim corners may be beveled to approximate corner rounding which may result from lithography. At each inside trim corner, an isosceles triangle may be added. The triangle may have perpendicular sides equal in length to a specified corner-rounding radius or another radius. An isosceles triangle may be subtracted at each outside trim corner.

Figure 6A:
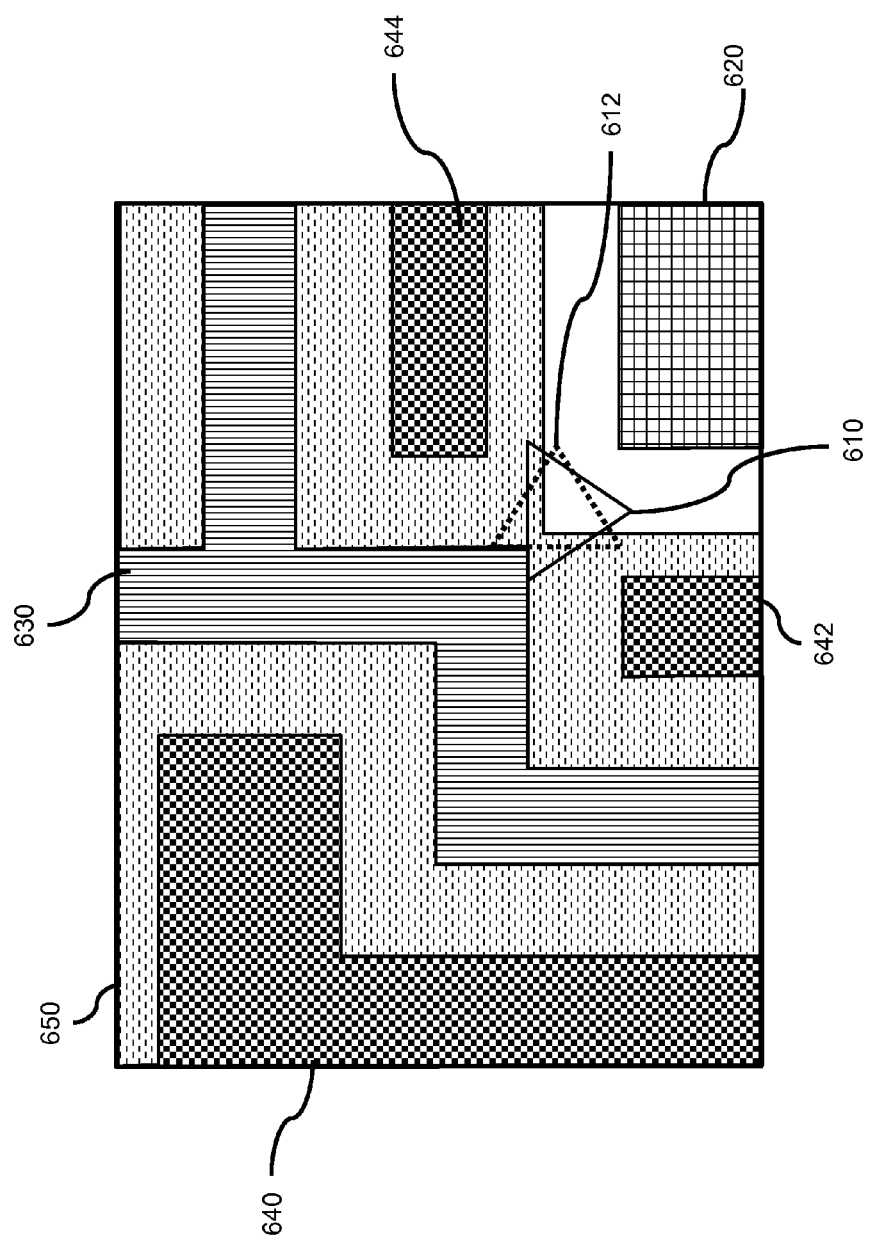
FIG. 6A is an example layout including the estimating of spur severity.

FIG. 6A is an example layout including the estimating of spur severity. A group of shapes 600 is shown to illustrate spur-severity estimating. The group of shapes may represent a design layout, where the design layout may include shapes for self-aligned double patterning (SADP). The example layout may include estimating the artifact. A computer-aided design tool may generate the design layout. The self-aligned double patterning may be based on spacer-is-dielectric (SID) technology. As illustrated in FIG. 5, the severity of an artifact or plurality of artifacts may be estimated. The artifacts may be spurs—unwanted superfluous material which may cause unintended electrical connections or act as electrical antennas. An artifact may result, for example, from rounding caused by an etching process and occur at various levels in the semiconductor chip and may be attached to various shapes. The artifact may occur at a concave corner of a spacer shape or a trim shape. Example shapes 600, or similar shapes, may be produced using design automation tools used to draw the various features and their contours on a semiconductor for fabrication using masks. As before, the plurality of mask levels may define sub-metal shapes, spacer-deposit widths, segments, mandrel neighbors, and so on. For example, shapes 630, 640, 642, and 644 may represent a target design with artifacts identified. The artifacts may be spurs. In this example, shapes 640, 642, and 644 represent main mandrels, while the example shape 620 represents additional mandrel material or "dummy" material which may be added as part of the fabrication process. The dummy material may be formed by positive contours. Example shape 630 represents sub metal which may be created by negative contours. Example shape 650 represents a trim mask where material is removed in order to help achieve the target design.

Example shape 610 is a triangle which is used to evaluate spur severity identified on a sub-metal shape. While in FIG. 5 the spurs are shown on sub-metal shapes between a main mandrel and additional mandrels, here the spur is shown on a sub-metal shape between two main mandrels. The severity of a given spur may be determined by the overlap of three regions: in embodiments, the spur axis triangle 610, dilated sub-metal segments, and a beveled trim mask. For the first region, a spur-axis triangle is constructed. For example, the shape 610 shows a spur-axis triangle. The triangle or triangles may be centered on a spur axis with the base of a triangle on a sub-metal edge with the opposite vertex of a triangle pointing outward from the sub-metal shape. The triangle may be an equilateral triangle with a side length which may be equal to the length of a non-touching segment. A side length may be twice the size of a spacer-deposit width. A second triangle 612 is shown with a base along the other edge of the sub-metal shape 630 along a corner where a spur can form and where the second triangle 612 can also be used for evaluating spur severity. For the second region, dilated sub-metal segments may be constructed. Junction points of spacer-deposit triangles and sub-metal edges may be found. Sub-metal corners may also be junction points. Sub-metal segments may be made between adjacent junction points. Portions of a sub-metal segment that touches a subtractive trim triangle may be deleted. Sub-metal segments which are outward from a sub-metal edge may be dilated by a distance of one spacer-deposit width or other width. In the case where a sub-metal corner has abutting sub-metal segments on both sides, a dilated square may be added between dilated sub-metal segments. For the third region, a trim mask may be beveled. Trim corners may be beveled to approximate corner rounding which may result from lithography. At each inside trim corner, an isosceles triangle with perpendicular sides which may be equal in length to a specified corner-rounding radius or another radius may be added. An isosceles triangle may be subtracted at each outside trim corner.

Figure 6B:
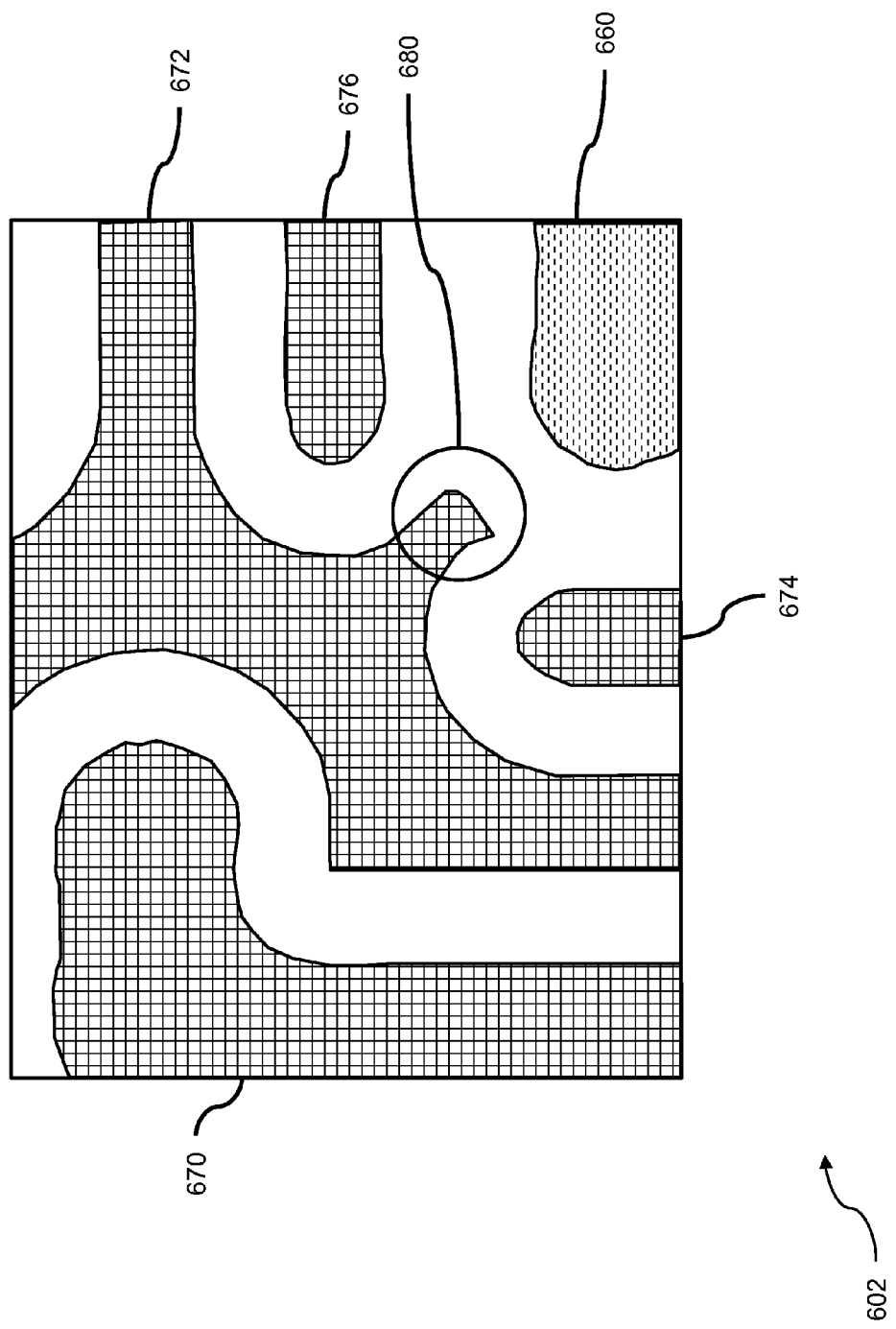
FIG. 6B shows example semiconductor shapes showing final contours with spur.

FIG. 6B shows example semiconductor shapes showing final contours with spur. A group of shapes 602 is shown to illustrate the final contours of mandrel, sub-metal, and spacer-drawn shapes. The contours of the shapes may include one or more artifacts, where an artifact may include a spur. The contours of the shapes may differ from the drawn shapes due to the lithographic and chemical processes used for fabricating integrated circuits. The final contours may result from a self-aligned double patterning process. The SADP process may be based on a spacer-is-dielectric technology. As before, an artifact may include a spur, where the spur may be unwanted material. The final contours may result from the lithographic and chemical processes which inadvertently produced artifacts such as spurs. Example shapes 602, or similar shapes, may be produced by lithographic and chemical processes. The final contours refer to structures on a semiconductor chip. In this example, shapes 670, 672, 674, and 676 represent the target design. However, the final contours—670, 672, 674, and 676—differ from the desired target design. An example shape 660 represents an additional mandrel or dummy feature structure which was added to aid in forming the desired target design. An example structure 680 represents an undesirable artifact or spur. As mentioned above, a spur may cause undesirable electrical connections or may form electrical antennas.

Figure 7:
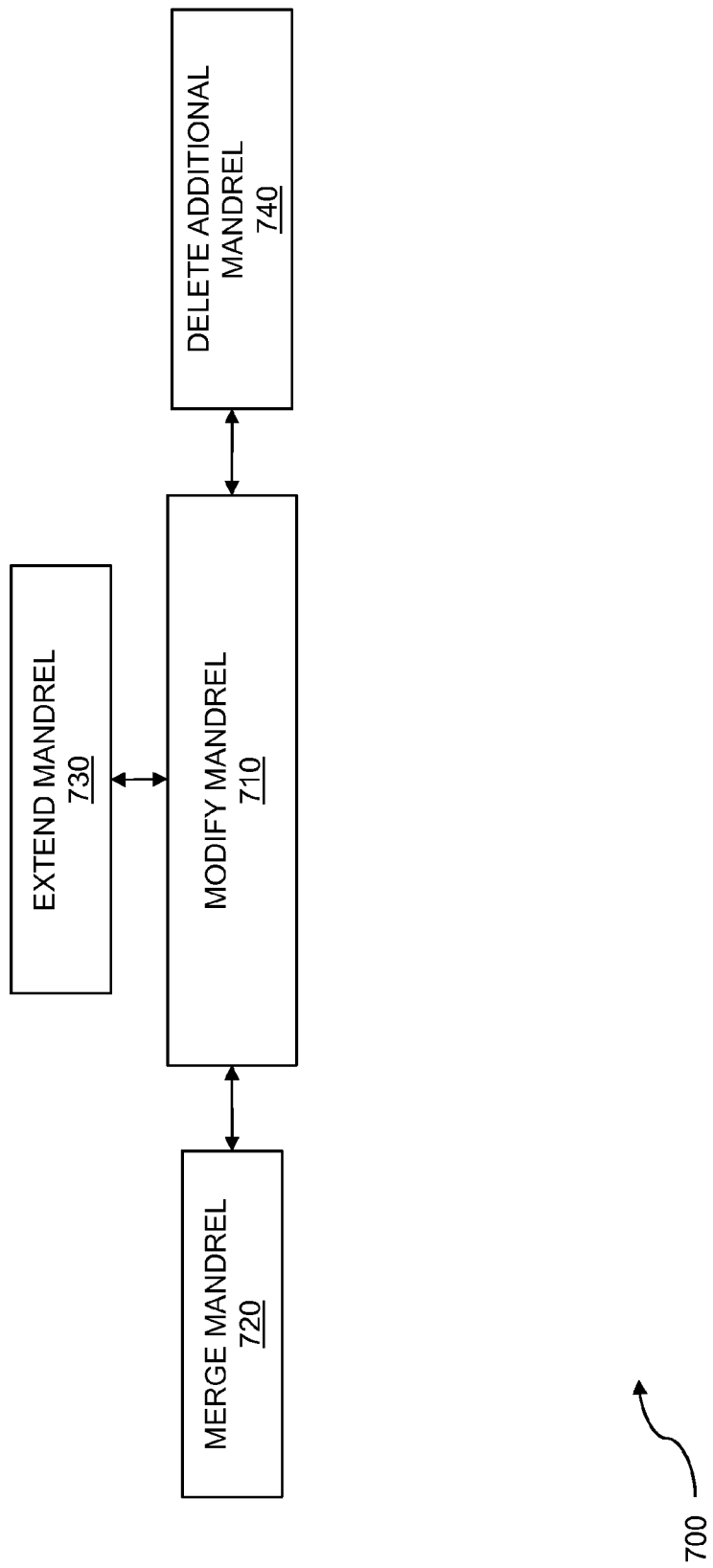
FIG. 7 is a flow diagram for mandrel modification.

FIG. 7 is a flow diagram for mandrel modification. A flow 700 may continue from or be part of a previous flow 100. In some embodiments, the flow 700 may stand on its own and may work from a pre-existing semiconductor chip design with wafer-print artifacts or other artifacts. The artifacts may result from lithographic and chemical processes or other processes. Spurs which are detected may be fixed by modifying a mandrel 710 or mandrels. The fixing may comprise merging, extending, or deleting mandrel structures on the mandrel mask based on a number of mandrel structure neighbor shapes. Mandrels may be merged 720 if there is a main mandrel near a spur and, in total, two or more mandrel pieces, where the mandrel pieces may include a main mandrel or an additional mandrel. Merging mandrels may reduce line-end shortening. Fixing may include performing mandrel structure merging to avoid end-to-end spacers on the mandrel mask. Mandrels may be extended 730 if there is a main mandrel near a spur and, in total, only one mandrel piece, where the mandrel piece may include a main mandrel or an additional mandrel. As before, extending mandrels may reduce line-end shortening. Additional mandrels may be deleted 740 if there is no main mandrel near or adjacent to a spur. Additional mandrels may be deleted if merging the mandrels would cause mask rule checking (MRC) violations.

Figure 8:
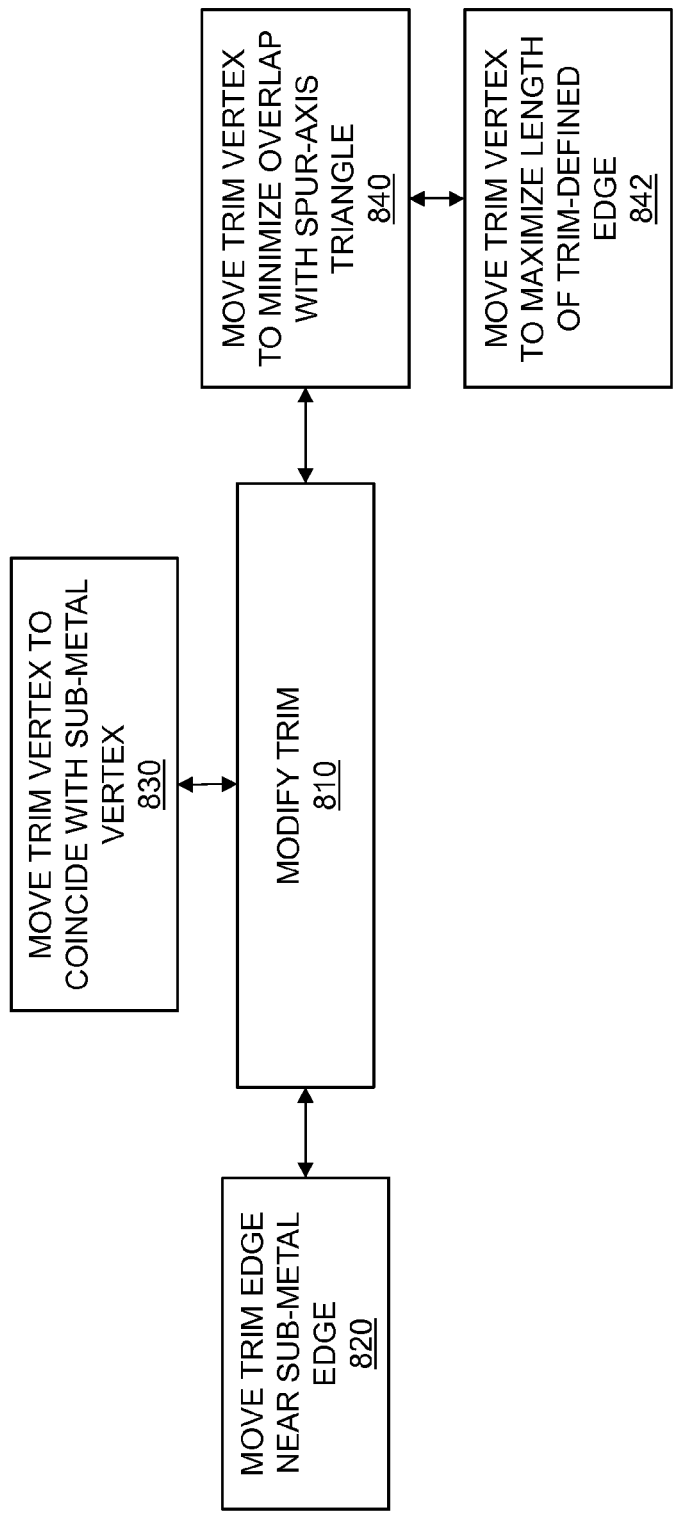
FIG. 8 is a flow diagram for trim modification.

FIG. 8 is a flow diagram for trim modification. A flow 800 may continue from or be part of a previous flow 100. In some embodiments, the flow 800 may stand on its own and may work from a pre-existing semiconductor chip design with wafer-print artifacts or other artifacts. The artifacts may result from lithographic and chemical processes or other processes. Recall that the various shapes may be produced using design-automation tools used to draw various features on a semiconductor for fabrication using masks. The various shapes or features on a semiconductor result in structures. A structure may be defined by mandrel structures on the mandrel mask along with spacer structures grown around the mandrel structures and trim shapes on the trim mask. Artifacts which are detected may include spurs. Spurs which are detected may be fixed by modifying a trim mask 810 or trim masks. The fixing may comprise a variety of modifications to a trim mask or masks. The trim straight edge may be moved 820 as close as possible to a sub-metal edge if there are no trim vertices within one spacer-deposit width of a spur axis. Other types of moves may be possible. A trim vertex may be moved 830 to coincide with a sub-metal vertex if there is a trim vertex near a spur axis with a curvature comparable to a sub-metal vertex. A trim vertex may be moved 840 to minimize an overlap between a trim mask and a spur-axis triangle if there is a trim vertex with an opposite curvature to that of a sub-metal vertex. Similarly, a trim vertex may be moved 842 to maximize a length of a trim-defined edge if there is a trim vertex on a sub-metal straight edge.

Figure 9:
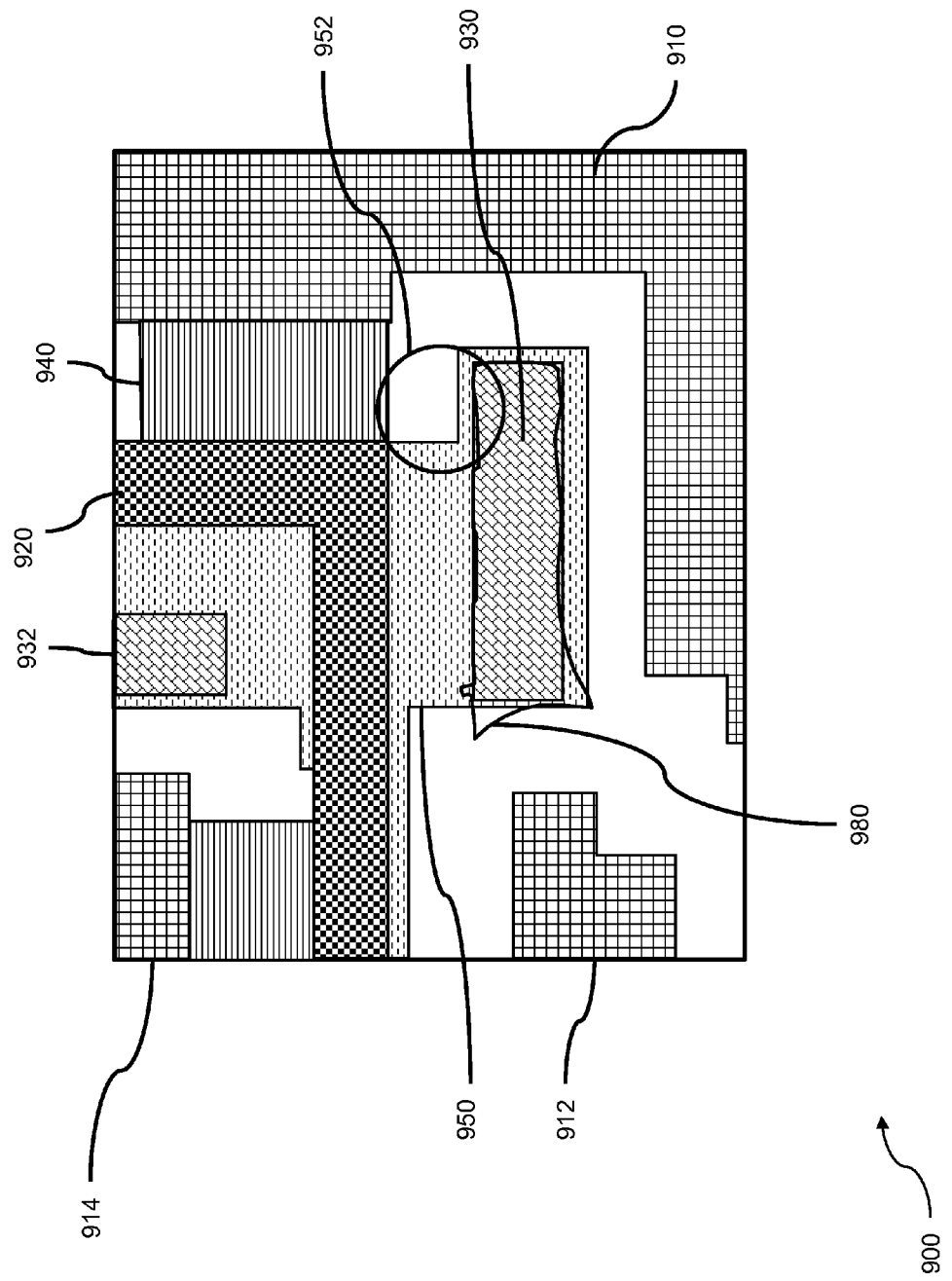
FIG. 9 is an example layout showing trim and spacer-deposit contours.

FIG. 9 is an example layout showing trim and spacer-deposit contours. A group of shapes 900 is shown to illustrate the impact of drawn shapes on the detecting of artifacts. As in FIG. 3A, a group of shapes may represent a design layout, where the design layout may include shapes for self-aligned double patterning (SADP). FIG. 9 shows the effect of modifying mandrel masks and trim masks. A computer-aided design tool may generate the design layout. The layout may include fixing the artifact based on modifying the trim mask to minimize the overlap. The self-aligned double patterning may be based on spacer-is-dielectric (SID) technology. An artifact or plurality of artifacts may be spurs—unwanted superfluous material which may cause unintended electrical connections or act as electrical antennas. An artifact may result from lithographic and chemical processes. An artifact may result, for example, from rounding caused by an etching process and occur at various levels or attached to various shapes within the semiconductor chip. The artifact may occur indirectly based on a gap between spacer shapes. Example shapes 900, or similar shapes, may be produced using design automation tools used to draw various features on a semiconductor for fabrication using masks. The plurality of mask levels may define sub-metal shapes, spacer-deposit widths, segments, or mandrel neighbors. The various features on a semiconductor result in structures. A structure may be defined by mandrel structures on the mandrel mask along with spacer structures grown around the mandrel structures and trim shapes on the trim mask. For example, shapes 920, 930, and 932 may represent a target design. In this example, shape 920 represents a main mandrel, while shapes 910, 912, and 914 represent additional mandrel material or "dummy" material which is added as part of the fabrication process. The dummy material may be formed from positive contours. Example shapes 930 and 932 represent sub-metal which may be created by negative contours. FIG. 9 differs from FIG. 3A in that the additional mandrel material 940 is provided and the trim mask 950 has been modified. For example, additional mandrel material has been added at 940. In addition, a notch in the trim mask 950 is shown at 952. The impact of the modifications to the mandrel material and to the trim mask may be reduced spur severity as can be seen on resulting sub-metal shape 980.

Figure 10A:
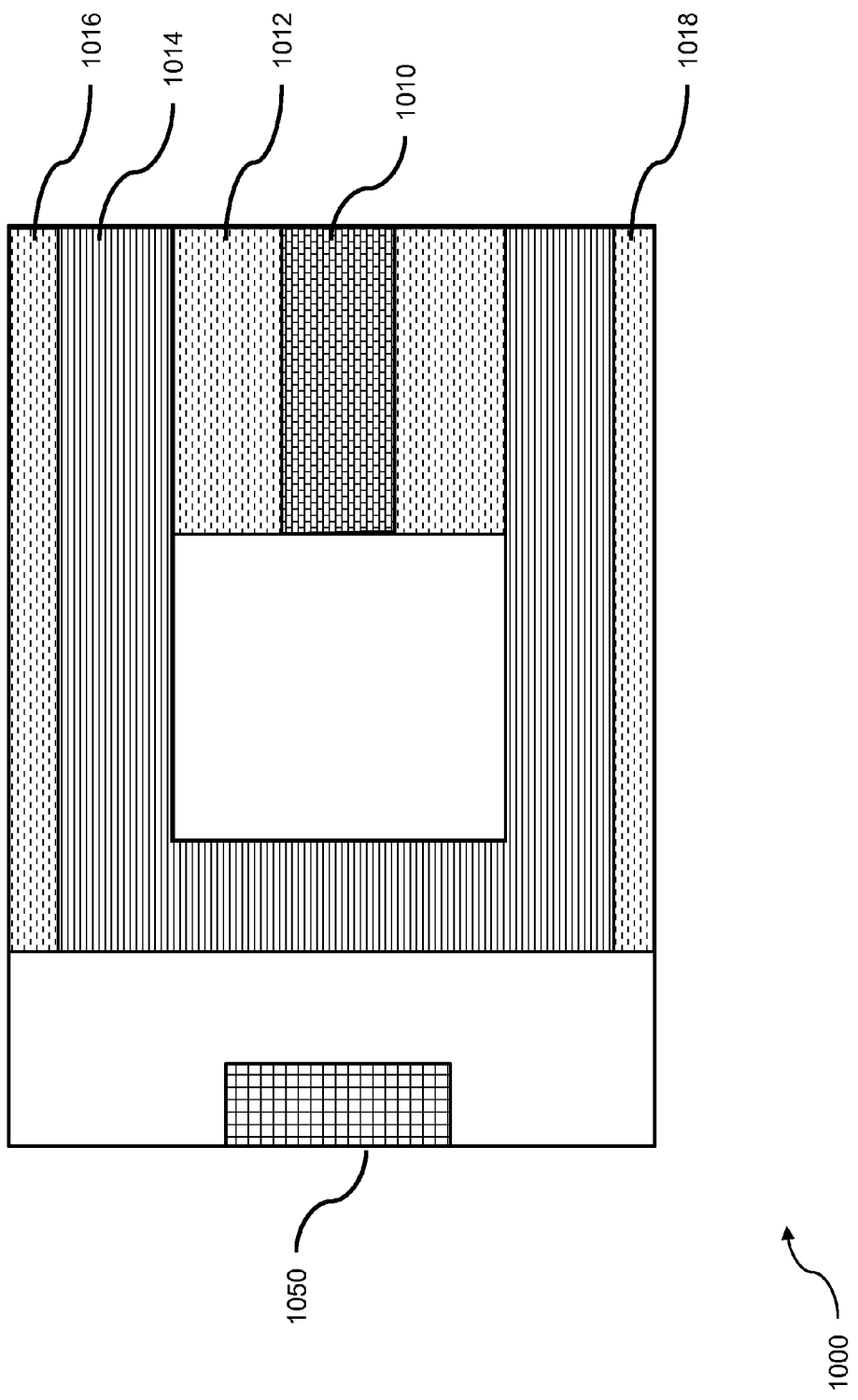
FIG. 10A is an example layout showing trim and mandrel shapes.

FIG. 10A is an example layout showing trim and mandrel shapes. A group of shapes 1000 is shown to illustrate the impact of drawn shapes on artifacts. As in FIGS. 3A and 9, a group of shapes may represent a design layout, where the design layout may include shapes for self-aligned double patterning (SADP). FIG. 10 shows the effect of trim and spacer-deposit contours on artifacts, including spurs. A computer-aided design tool may generate the design layout. The layout may include fixing the artifacts based on modifying the trim mask to minimize the overlap. The self-aligned double patterning may be based on spacer-is-dielectric (SID) technology. An artifact or plurality of artifacts may be spurs—unwanted superfluous material which may cause unintended electrical connections or act as electrical antennas. An artifact may occur when a rounded trim-pattern intersects a rounded spacer-pattern. An artifact may result from lithographic and chemical processes. Example shapes 1000, or something similar to them, may be produced using design automation tools to draw various features on a semiconductor for fabrication using masks. The plurality of mask levels may define trim and spacer-deposit contours. The various features on a semiconductor result in structures. A structure may be defined by mandrel structures on a mandrel mask, spacer structures grown around the mandrel structures, and trim shapes on the trim mask. For example, shapes 1010 and 1014 may represent a target design. In this example, shape 1010 represents a main mandrel, while example shape 1050 represents additional mandrel material or "dummy" material which is added as part of the fabrication process. The dummy material may be formed by positive contours. Example shape 1014 represents sub metal which may be created by negative contours. In this example, shape 1012 represents a trim mask.

Figure 10B:
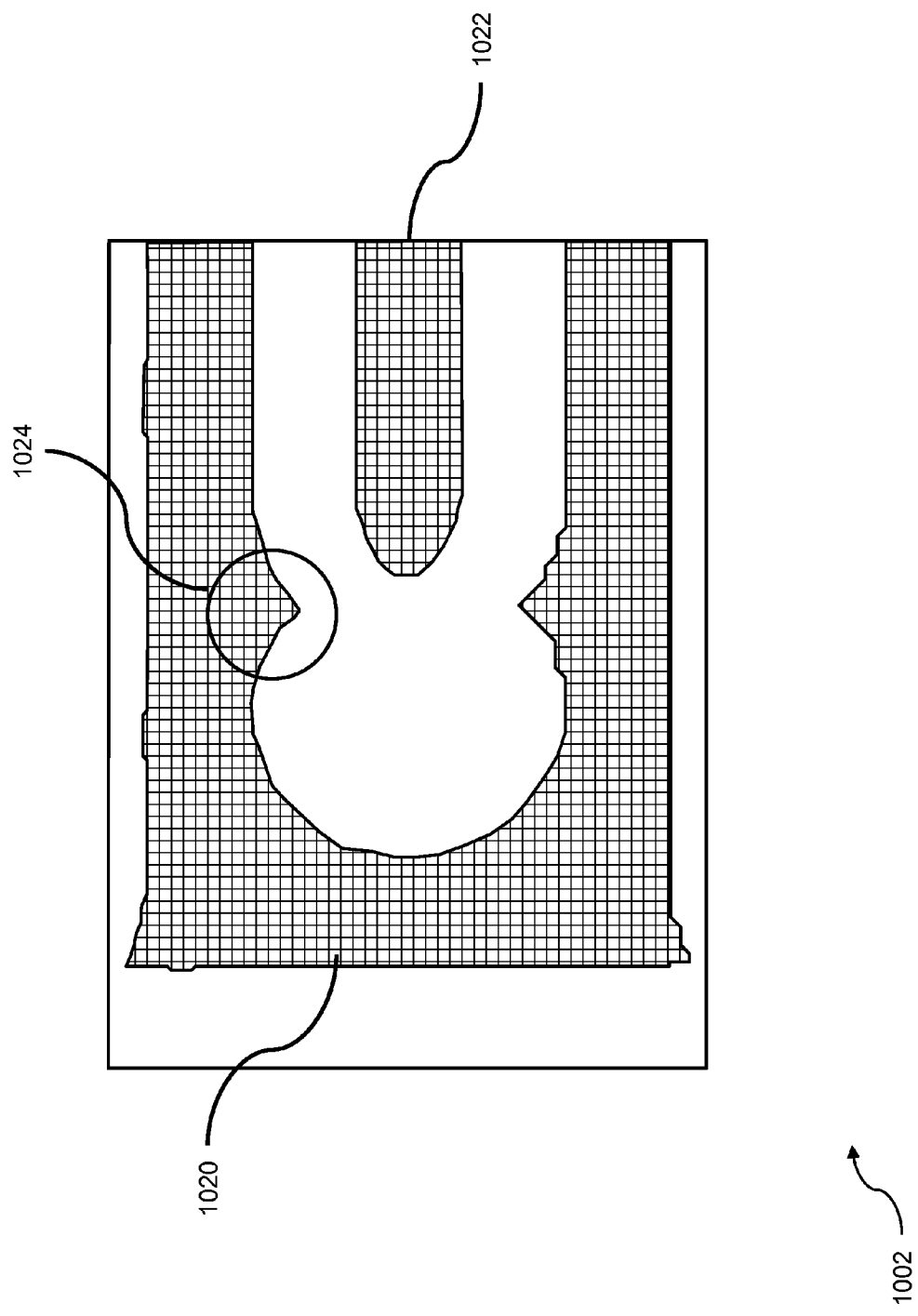
FIG. 10B shows example semiconductor shapes showing final contours with spurs.

FIG. 10B shows example semiconductor shapes showing final contours with spurs. A group of shapes 1002 is shown to illustrate the final contours of mandrel, sub metal, spacer, and trim drawn shapes. The contours of the shapes may include one or more artifacts, where an artifact may include a spur. The contours of the shapes may differ from the drawn shapes due to lithographic and chemical processes used for fabricating integrated circuits. The final contours may result from a self-aligned double patterning process. The SADP process may be based on a spacer-is-dielectric technology. As in FIG. 3B an artifact may be a spur where the spur may be unwanted material. The final contours may result from lithographic and chemical processes which inadvertently produced artifacts such as spurs. Example shapes 1002, or something like them, may be produced from lithographic and chemical processes. The final contours refer to structures on a semiconductor chip. In the example given, shapes 1020 and 1022 represent the target design. The final contours of 1020 and 1022 differ from the desired target design. Example structure 1024 represents an undesirable artifact or spur. As mentioned above, a spur may cause undesirable electrical connections or may form electrical antennas.

Figure 10C:
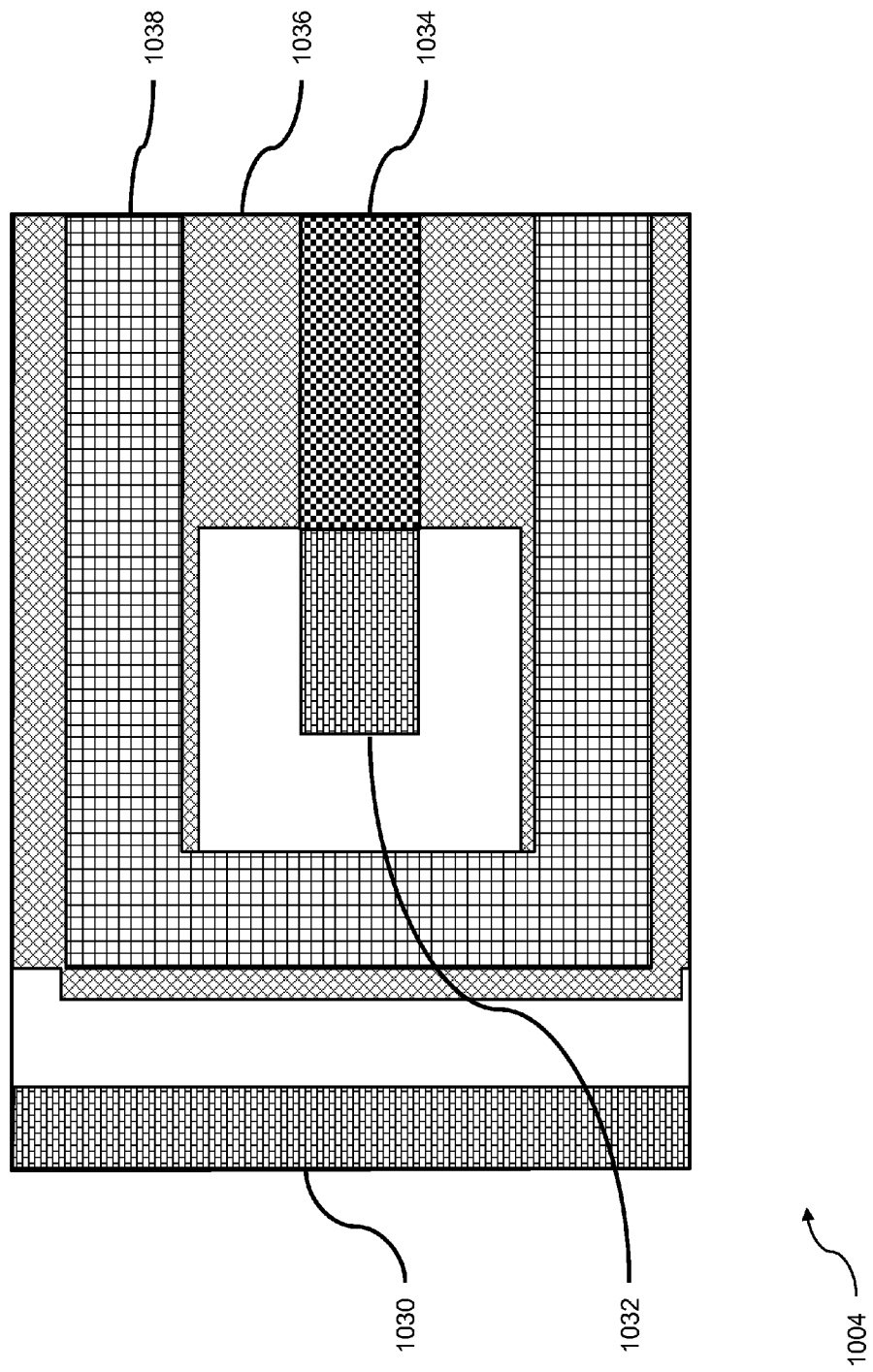
FIG. 10C is an example layout showing mandrel extension.

FIG. 10C is an example layout showing mandrel extension. A group of shapes 1006 is shown to illustrate the extension and addition of mandrel shapes. As in FIGS. 3A and 9, a group of shapes may represent a design layout, where the design layout may include shapes for self-aligned double patterning (SADP). FIG. 10C shows the effect of mandrel material extension and addition on trim and spacer-deposit contours. A computer-aided design tool may generate the design layout. The layout may include fixing. The fixing may comprise merging, extending, or deleting mandrel structures on the mandrel mask based on a number of mandrel structure neighbor shapes. The self-aligned double patterning may be based on spacer-is-dielectric (SID) technology. An artifact or plurality of artifacts may be spurs—unwanted superfluous material which may cause unintended electrical connections or act as electrical antennas. An artifact may result from lithographic and chemical processes. Example shapes 1004, or similar shapes, may be produced using design automation tools to draw various features on a semiconductor for fabrication using masks. The plurality of mask levels may define trim and spacer-deposit contours. The various features on a semiconductor result in structures. A structure may be defined by mandrel structures on a mandrel mask, spacer structures grown around the mandrel structures, and trim shapes on the trim mask. For example, shapes 1034 and 1038 may represent a target design. In the example given, shape 1034 represents a main mandrel, while example shapes 1030 and 1032 represent additional mandrel material or "dummy" material which is added as part of the fabrication process. Example shape 1032 is an extension of mandrel 1034. The dummy material may be formed by positive contours. Example shape 1038 represents sub metal which may be created by negative contours. In this example, shape 1036 represents a trim mask where material is removed as part of the fabrication process.

Figure 10D:
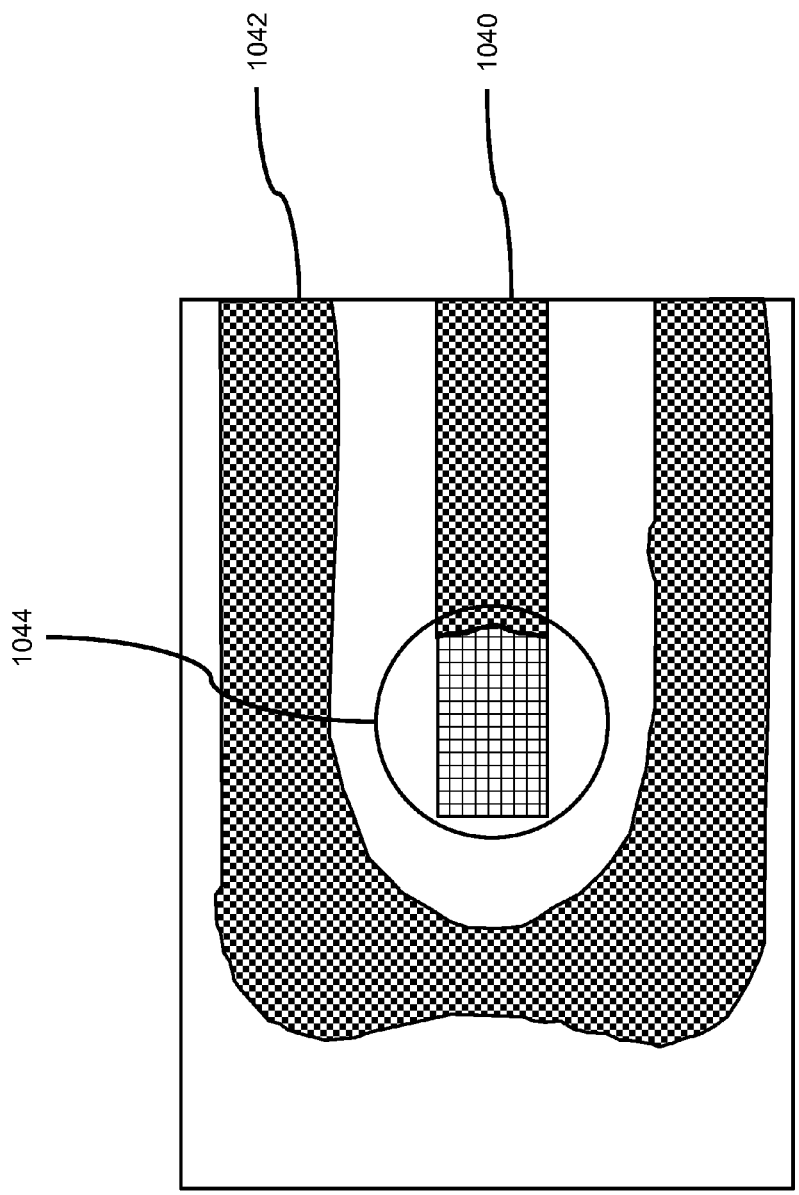
FIG. 10D shows example semiconductor shapes without spurs.

FIG. 10D shows example semiconductor shapes without spurs. A group of shapes 1006 is shown to illustrate the final contours of mandrel, sub metal, spacer, and trim drawn shapes. A computer-aided design tool may generate the design layout. The layout may include fixing. The fixing of an artifact may include reducing a spur. The contours of the shapes may differ from the drawn shapes due to lithographic and chemical processes used for fabricating integrated circuits. The final contours may result from a self-aligned double patterning process. The SADP process may be based on a spacer-is-dielectric technology. The final contours may result from lithographic and chemical processes which inadvertently produced artifacts such as spurs. Example shapes 1006, or similar shapes, may be produced using lithographic and chemical processes. The final contours refer to structures on a semiconductor chip. In this example, shapes 1040 and 1042 represent the target design. The final contours of 1040 and 1042 differ from the desired target design. An example structure 1044 represents an extension to a main mandrel 1040. Spurs 1024 which were evident in FIG. 10B have been removed by addition of a mandrel extension 1044.

Figure 11:
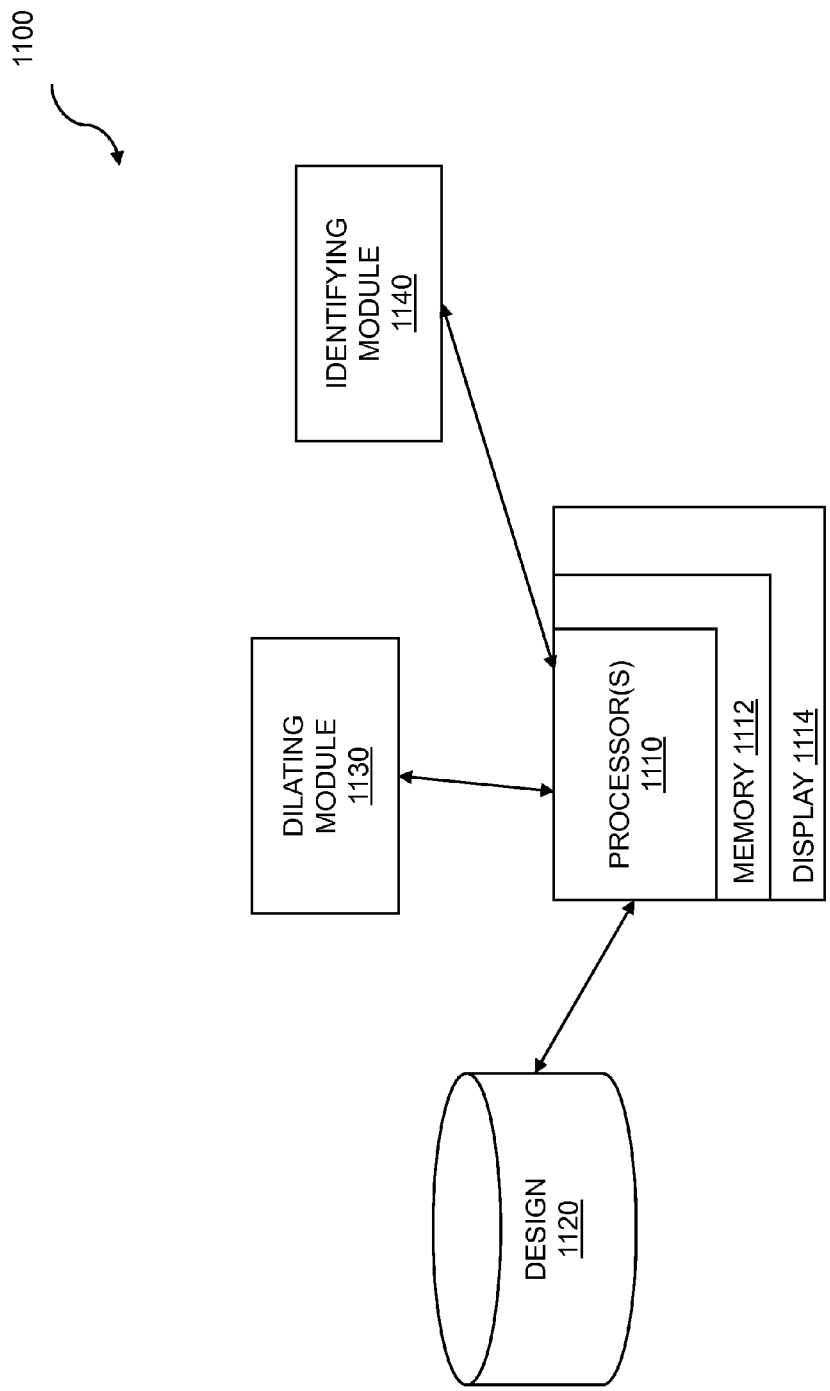
FIG. 11 is a system diagram for detection and removal of artifacts.

FIG. 11 is a system diagram for detection and removal of artifacts. The system 1100 comprises a computer-implemented method for semiconductor layout analysis. The computer-implemented method for semiconductor layout analysis includes obtaining a design layout comprising a representation for a plurality mask levels including a mandrel mask and a trim mask, dilating a sub-metal shape derived from the plurality of mask levels, identifying an spur based on the sub-metal shape which was dilated, and modifying one or more of the plurality of masks to reduce the spur that was identified. A system 1100 may include one or more processors 1110 as well as a dilating module 1130 and an identifying module 1140. The one or more processors 1110 are coupled to a memory 1112, which stores instructions, and a display 1114. The display 1114 may be any electronic display, including but not limited to, a computer display, a laptop screen, a net-book screen, a tablet computer screen, a cell phone display, a mobile device display, a remote with a display, a television, a projector, or the like. The memory 1112 may store code, mask information, layer information, design data, instructions, system support data, intermediate data, analysis results, and the like.

The processors 1110 may be configured to access a design 1120, a dilating module 1130, and an identifying module 1140. In at least one embodiment, the one or more processors 1110 accomplish the functions of the dilating module 1130 and the identifying module 1140. The processors 1110 may be configured to obtain a mask design for analysis and fixing comprising at least one layer wherein the mask design includes mandrels, sub metal, spacers, and trim drawn shapes. The processors 1110 may be configured to dilate 1130 a sub-metal shape by a spacer-deposit width. The metal shape which is dilated may be an artifact resulting from a lithographic process. The artifact may be a spur. The processors 1110 may be configured to identify 1140 a spur or spurs in a sub-metal shape. A spur may be identified between primary and secondary mandrels. A spur may be identified between main mandrels. The identifying may involve finding a segment that is not touching a mandrel neighbor, where a mandrel neighbor may be a main mandrel or additional mandrels. The identifying may find junction points between a segment touching one or more mandrels and a segment not touching one or more mandrels. The identifying may find a spur axis. The system 1100 may include computer program product embodied in a non-transitory computer readable medium for design analysis comprising code for obtaining a design layout comprising a representation for a plurality mask levels wherein the plurality of mask levels include a mandrel mask and a trim mask, code for dilating a sub-metal shape derived from at least one of the plurality of mask levels, and code for identifying an artifact based on the sub-metal shape which was dilated.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for layout analysis comprising:

obtaining a design layout comprising a representation for a plurality mask levels wherein the plurality of mask levels include a mandrel mask and a trim mask;

dilating, using one or more processors, a sub-metal shape derived from at least one of the plurality of mask levels; and identifying an artifact based on the sub-metal shape which was dilated, wherein the artifact includes a spur.

2. The method of claim 1 wherein the identifying is based on rules.

3. The method of claim 1 further comprising estimating a severity of the artifact.

4. The method of claim 3 wherein the estimating is rule based.

5. The method of claim 3 wherein the estimating further comprises computing overlap between a drawn shape and a beveled version of a shape from the trim mask.

6. The method of claim 5 further comprising fixing the artifact based on modifying the trim mask to minimize the overlap.

7. The method of claim 1 further comprising fixing the artifact that was identified.

8. The method of claim 7 wherein the fixing the artifact includes reducing the spur.

9. The method of claim 7 wherein the fixing the artifact further comprises modifying a decomposition of drawn patterns.

10. The method of claim 9 wherein the fixing further comprises adding a mandrel-mask shape.

11. The method of claim 9 wherein the fixing further comprises removing a trim-mask shape.

12. The method of claim 9 wherein the drawn patterns are based on two mask levels.

13. The method of claim 9 wherein the fixing further comprises merging mandrel shapes.

14. The method of claim 7 wherein the fixing comprises modifying the mandrel mask based on mandrel neighbor shapes.

15. The method of claim 14 wherein the fixing further comprises merging, extending, or deleting mandrel structures on the mandrel mask based on a number of mandrel structure neighbor shapes.

16. The method of claim 15 further comprising estimating a severity of the artifact wherein the estimating is rule based and wherein the estimating comprises computing overlap between a drawn shape and a beveled version of a shape from the trim mask and wherein the fixing the artifact is based on modifying the trim mask to minimize the overlap.

17. The method of claim 7 wherein the fixing includes performing mandrel structure extension to avoid end-to-end spacers on the mandrel mask.

18. The method of claim 7 wherein the fixing includes performing mandrel structure merging to avoid end-to-end spacers on the mandrel mask.

19. The method of claim 7 wherein the fixing is systematically applied across at least one of the plurality of mask levels.

20. The method of claim 1 wherein the artifact occurs when a rounded trim-pattern intersects a rounded spacer-pattern.

21. The method of claim 1 wherein the artifact occurs indirectly based on a gap between spacer shapes.

22. The method of claim 1 wherein the artifact occurs at a concave corner of a spacer shape or a trim shape.

23. The method of claim 1 wherein the identifying is based on weighting.

24. The method of claim 23 wherein the weighting includes having concave corners being given a higher weighting.

25. The method of claim 1 wherein a structure is defined by mandrel structures on the mandrel mask along with spacer structures grown around the mandrel structures and trim shapes on the trim mask.

26. The method of claim 1 wherein the dilating the sub-metal shape is by a spacer width.

27. The method of claim 26 wherein the identifying is based on finding a dilated shape that does not touch a mandrel neighbor.

28. The method of claim 27 further comprising finding a junction point between a shape touching a mandrel and a shape not touching a mandrel and determining a spur axis location based on moving along the shape not touching the mandrel by a spacer-deposit width.

29. The method of claim 1 wherein the design layout includes shapes for self-aligned double patterning.

30. The method of claim 29 wherein the self-aligned double patterning is based on spacer-is-dielectric technology.

31. The method of claim 1 wherein the plurality of mask levels defines sub-metal shapes, spacer-deposit widths, segments, or mandrel neighbors.

32. A computer-implemented method for semiconductor layout analysis comprising:

obtaining a design layout comprising a representation for a plurality mask levels including a mandrel mask and a trim mask;

dilating, using one or more processors, a sub-metal shape derived from the plurality of mask levels;

identifying a spur based on the sub-metal shape which was dilated; and modifying one or more of the plurality of mask levels to reduce the spur that was identified.

33. A computer system for design analysis comprising:

a memory which stores instructions;

one or more processors coupled to the memory wherein the one or more processors are configured to:

obtain a design layout comprising a representation for a plurality mask levels wherein the plurality of mask levels include a mandrel mask and a trim mask;

dilate a sub-metal shape derived from at least one of the plurality of mask levels; and identify an artifact based on the sub-metal shape which was dilated, wherein the artifact includes a spur.

34. The system of claim 33 further comprising code for estimating a severity of the artifact.

35. The system of claim 34 wherein the estimating further comprises computing overlap between a drawn shape and a beveled version of a shape from the trim mask.

36. The system of claim 35 further comprising code for fixing the artifact based on modifying the trim mask to minimize the overlap.

37. The system of claim 33 further comprising code for fixing the artifact that was identified and estimating a severity of the artifact where the estimating comprises computing overlap between a drawn shape and a beveled version of a shape from the trim mask and where the fixing is based on modifying the trim mask to minimize the overlap.

38. A computer program product embodied in a non-transitory computer readable medium for design analysis comprising:

code for obtaining a design layout comprising a representation for a plurality of mask levels wherein the plurality of mask levels includes a mandrel mask and a trim mask;

code for dilating a sub-metal shape derived from at least one of the plurality of mask levels; and code for identifying an artifact based on the sub-metal shape which was dilated, wherein the artifact includes a spur.

39. The computer program product of claim 38 further comprising code for estimating a severity of the artifact.

40. The computer program product of claim 39 wherein the estimating further comprises computing overlap between a drawn shape and a beveled version of a shape from the trim mask.

41. The computer program product of claim 40 further comprising code for fixing the artifact based on modifying the trim mask to minimize the overlap.

42. The computer program product of claim 38 further comprising code for fixing the artifact that was identified and estimating a severity of the artifact where the estimating comprises computing overlap between a drawn shape and a beveled version of a shape from the trim mask and where the fixing is based on modifying the trim mask to minimize the overlap.

* * * * *